United States Patent [19]

Sichanugrist et al.

[11] Patent Number: 5,248,345
[45] Date of Patent: Sep. 28, 1993

[54] INTEGRATED PHOTOVOLTAIC DEVICE

[75] Inventors: Porponth Sichanugrist; Norimitsu Tanaka, both of Tokyo, Japan

[73] Assignee: Showa Shell Sekiyu K.K., Tokyo, Japan

[21] Appl. No.: 777,162

[22] Filed: Oct. 16, 1991

[30] Foreign Application Priority Data

Oct. 17, 1990 [JP] Japan .................. 2-276432

[51] Int. Cl.$^5$ .......................... H01L 31/05
[52] U.S. Cl. .................. 136/244; 136/256; 136/258; 204/192.17
[58] Field of Search ........ 136/244, 256, 258 AM; 204/192.17

[56] References Cited

U.S. PATENT DOCUMENTS 4,623,751 11/1986 Kishi et al. ............... 136/244
4,668,840 5/1987 Kiyama et al. ............ 136/244

FOREIGN PATENT DOCUMENTS 0275166 7/1988 European Pat. Off. .
0392695 10/1990 European Pat. Off. .

OTHER PUBLICATIONS

*17th IEEE Photovoltaic Specialists Conference*, May 1, 1984, pp. 580–583.
*Patent Abstracts of Japan*, vol. 6, No. 144 (E–122), Aug. 3, 1982 (JP-A-57 068 081).
*Patent Abstracts of Japan*, vol. 8, No. 13 (E–222), Jan. 20, 1984 (JP-A-58 178 573).

*Primary Examiner*—Aaron Weisstuch
*Attorney, Agent, or Firm*—Sughrue, Mion, Zinn, Macpeak & Seas

[57] ABSTRACT

An integrated photovoltaic device which comprises a plurality of amorphous silicon based solar cells each comprising on the light-receiving side of a common transparent substrate, a transparent electrode, a metal electrode on the transparent electrode, and an amorphous semiconductor layer interposed between the metal electrode and the transparent electrode, said plurality of solar cells being interconnected in a series or series-parallel fashion by means of said transparent electrode and said metal electrode, said metal electrode being formed of a metal film comprising, in superposition in order from the amorphous semiconductor layer side, layers of aluminum, an additive metal for aluminum bronze, and copper.

3 Claims, 2 Drawing Sheets

5,248,345

INTEGRATED PHOTOVOLTAIC DEVICE

FIELD OF THE INVENTION

This invention relates to photovoltaic devices for use in solar cells, photosensors, and other applications. More specifically, this invention relates to an integrated photovoltaic device having a plurality of power generating zones on a thin film interconnected in a series or series-parallel fashion.

BACKGROUND OF THE INVENTION

Integrated photovoltaic devices have a basic structure wherein a transparent electrode layer, an amorphous semiconductor layer, and a metal electrode layer are superposed on a transparent insulating substrate. An example of such integrated photovoltaic devices is described below with reference to the amorphous silicon (hereunder abbreviated as "a-Si") solar cell illustrated in FIG. 2. The a-Si solar cell system shown in FIG. 2 comprises a plurality of unit solar cells that are connected in a series or series-parallel fashion and each of which comprises a common transparent insulating substrate that has a transparent electrode layer, an amorphous semiconducting silicon layer, and a metal electrode layer superposed thereon. The metal electrode layer is composed of the combination of back electrodes and lead wire connecting terminals. More specifically, the a-Si solar cell system comprises a single glass substrate 1 that has transparent electrodes 2 (21-23), a-Si film regions 3, and back electrodes 4 (41-43) superposed thereon to form a plurality of unit solar cells. The individual unit solar cells are interconnected via channels 50-52 such that the back electrode of a unit solar cell contacts the transparent electrode of an adjacent unit cell. Lead wires are connected at terminals 40 and 43 in the form of a metal film. Lead wires can be connected either by soldering them onto an adhesive-backed electroconductive tape that is attached to the terminals 40 and 43 or by directly connecting them to the terminals with the aid of an electroconductive adhesive.

These conventional methods of providing lead wires have a common problem in that they reduce the production rate of finished solar cell systems. In the case of using adhesive-backed conductive tape, attaching them to the terminals is a time-consuming operation, and when using a conductive adhesive, an extra step of drying the applied adhesive is necessary.

SUMMARY OF THE INVENTION

An object of the present invention is to provide an integrated photovoltaic device that permits easy soldering of lead wires and has high operating reliability.

This object of the present invention can be attained by an integrated photovoltaic device which comprises a plurality of amorphous silicon based solar cells, each comprising on the light-receiving side of a common transparent substrate, a transparent electrode, a metal electrode on the transparent electrode, and an amorphous semiconductor layer interposed between the transparent electrode and the metal electrode, said plurality of solar cells being interconnected in a series or series-parallel fashion by means of said transparent electrode and said metal electrode, said metal electrode being formed of a metal film comprising, in superposition in order from the amorphous semiconductor layer side, layers of aluminum, an additive metal for aluminum bronze, and copper.

Examples of the additive metal for aluminum bronze include nickel, iron, and manganese, with nickel being preferred.

The use of the superposed layers of aluminum, an additive metal for aluminum bronze, and copper as the material of the back electrode and the lead wire connecting terminals insures reliable contact with amorphous silicon. At the same time, possible thermal deterioration of the aluminum-copper bond is prevented by the intermediate layer of an additive metal for aluminum bronze, for example, nickel, and this not only helps improve the yield of photovoltaic devices produced but also permits lead wires to be soldered in an easy way.

DETAILED DESCRIPTION OF THE INVENTION

Figure 1D:
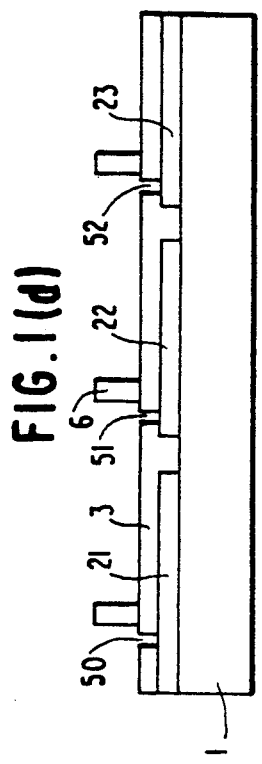
FIGS. 1(a)–1(f) show the sequence of major steps for fabricating an integrated solar cell, which is an example of the integrated photovoltaic device of the present invention.
Figure 1E:
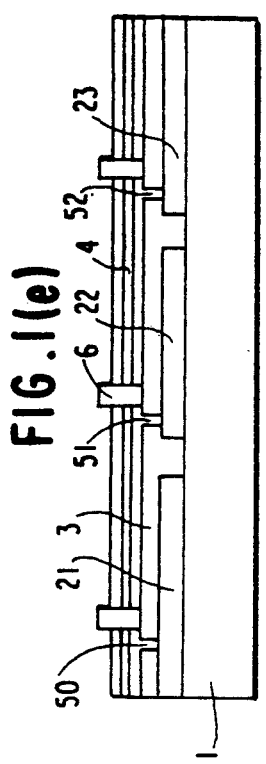
Figure 1F:
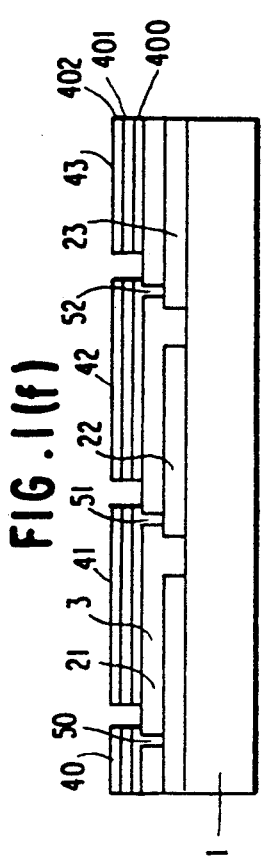

An embodiment of the present invention is described hereinafter with reference to FIGS. 1 and 3. FIG. 1(f) is a diagram showing the basic structure of an integrated solar cell incorporating the concept of the present invention, and FIGS. 1(a)–1(e) show the major steps of fabricating the solar cell. In FIGS. 1(a)–1(f), those components which are the same as those shown in FIG. 2 are identified by like numerals.

The photovoltaic device of the present invention is characterized by a metallic back electrode, which does not have the conventional, single-layer structure of aluminum but has a three-layer structure composed of aluminum, an additive metal for aluminum bronze, and copper. More specifically, the integrated solar cell shown in FIG. 1(f) comprises a transparent insulating substrate 1 having a transparent electrode layer 2, an amorphous semiconductor layer 3, and a metal electrode layer 4 formed thereon in superposition. The metal electrode layer 4 has a laminated structure consisting of, in order from the amorphous semiconductor layer side 3, an aluminum layer 400, a layer of additive metal for aluminum bronze 401, and a copper layer 402. The process of fabricating the integrated solar cell shown in FIG. 1(f) is described below more specifically.

Figure 1A:
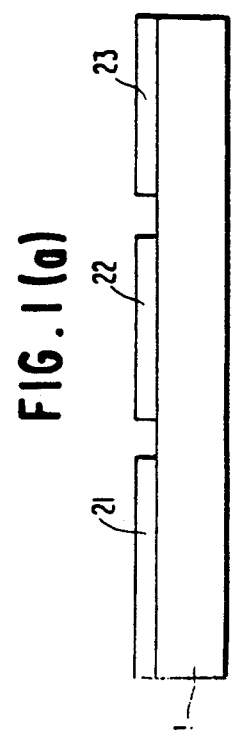
Figure 1B:
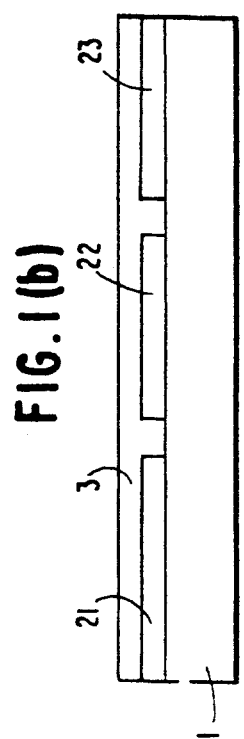
Figure 1C:
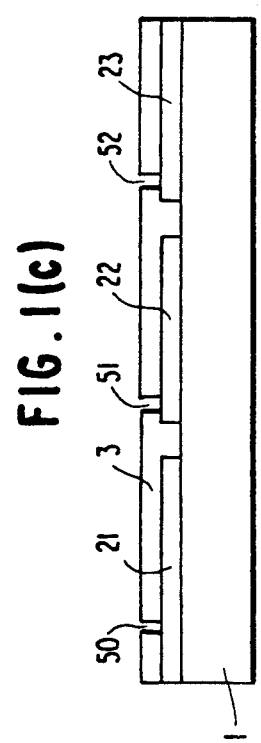
Figure 2:
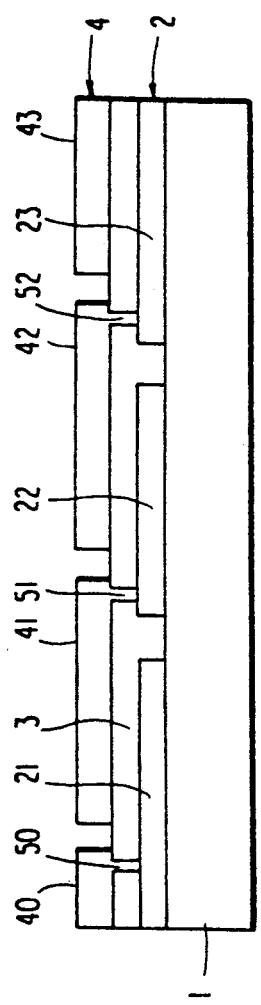
FIG. 2 is a diagram showing the structure of a prior art integrated solar cell.

In the first step, a transparent electroconductive film made of ITO (indium tin oxide) or $SnO_2$ (tin oxide) is formed on the glass substrate 1 by thermal CVD, electron beam evaporation, or sputtering as shown in FIG. 1(a). The deposited transparent conductive film is patterned with a YAG laser beam at 1.06 μm to form transparent electrodes 2 (21–23). In the next step, a-Si film 3 having a pin junction is formed in a thickness of about 0.3–0.8 μm by plasma-assisted CVD, as shown in FIG. 1(b). Further, as shown in FIG. 1(c), the a-Si film 3 is patterned with a YAG laser beam (1.06 μm) as applied from the glass substrate side, whereby cell interconnecting channels 50–52 are formed.

Subsequently, in order to form a plurality of back electrodes 41 and 42 as well as output terminals 40 and 43 (also serving as back electrodes) on the a-Si film 3, a mask for back electrode formation 6 having windows of a predetermined shape is printed as shown in FIG. 1(d). By sputtering through the mask, a laminated metal film that is to serve as back electrodes 41 and 42 and as output terminals 40 and 43 is deposited by sputtering as shown in FIG. 1(e). This metal film is of a three-layer structure that consists of, in order from the a-Si film side, aluminum 400, an additive metal for aluminum bronze 401, and copper 402. The three-layer film has a thickness of about 0.2–0.8 μm. Thereafter, mask 6 is removed, whereby a plurality of back electrodes 41 and 42 having a predetermined shape as well as lead wire terminals 40 and 43 are formed as shown in FIG. 1(f). The terminals 40 and 43 as well as back electrodes 41 and 42 are respectively connected to the transparent electrodes 21–23 via cell interconnecting channels 50–52, whereby the unit solar cells are connected in either a series or series-parallel fashion to construct an amorphous silicon based integrated solar cell system.

The metal film formed on the back side of the system to provide a metal electrode has high thermal resistance since it has the layer of additive metal for aluminum bronze interposed between the layer of aluminum which provides good contact with the a-Si film and the copper layer which can be easily soldered. If the copper layer were directly superposed on the aluminum layer, the thermally brittle aluminum-copper alloy at the interface of the two layers would be destroyed during soldering. Exemplary metals that can be used as additives for aluminum bronze include nickel, iron, and manganese.

Figure 3:
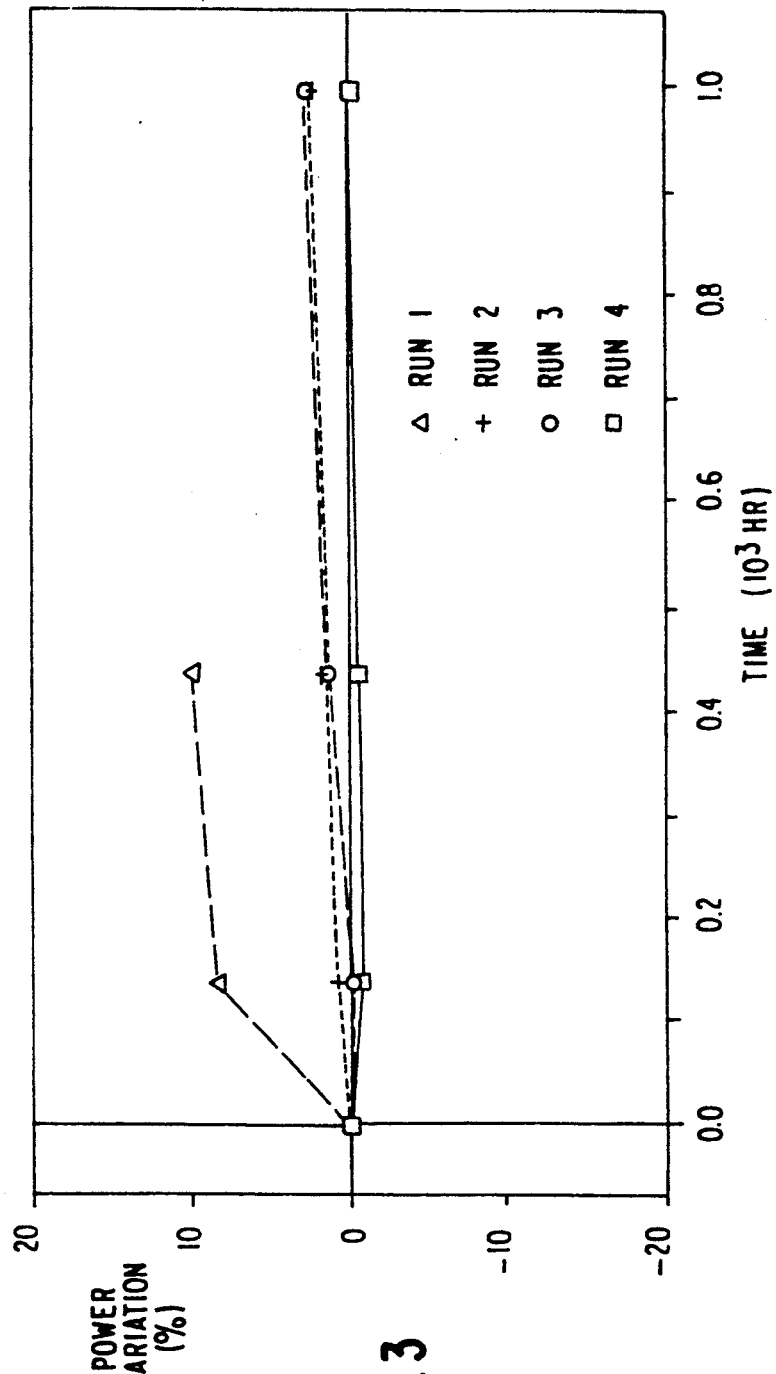
FIG. 3 is a graph showing the results of a test conducted to evaluate the storage stability of the integrated solar cell of the present invention in a hot and humid atmosphere.

FIG. 3 is a graph showing the results of a test conducted to evaluate the storage stability of the integrated solar cell of the present invention in a hot and humid atmosphere (85° C.×90% r.h.), with humidity being the ratio of the actual value of water vapor pressure to the saturated value as expressed in percent. In view of data reliability, the test was conducted using four samples each having the same structure as shown in FIG. 1(f). The horizontal axis of the graph in FIG. 3 plots the storage time, and the vertical axis plots the percent variation in cell output. The solar cell tested used nickel as the additive metal for aluminum bronze and lead wires were soldered to the output terminals, with the soldered areas not being protected at all. In the test, the cell output did not change significantly even after the passage 1000 h, demonstrating the high reliability of the integrated solar cell of the present invention.

As described above, the use of the superposed layers of aluminum, an additive metal for aluminum bronze, and copper as the material of the back electrode in the present invention enables efficient production of integrated photovoltaic devices that permit easy soldering of lead wires and that operate with high reliability.

While the invention has been described in detail and with reference to specific embodiments thereof, it will be apparent to one skilled in the art that various changes and modifications can be made therein without departing from the spirit and scope thereof.

What is claimed is:

1. An integrated photovoltaic device which comprises a plurality of amorphous silicon based solar cells, each comprising on the light-receiving side of a common transparent substrate, a transparent electrode, a metal electrode on said transparent electrode, and an amorphous semiconductor layer interposed between the transparent electrode and the metal electrode, said plurality of solar cells being interconnected in a series or series-parallel fashion by means of said transparent electrode and said metal electrode, said metal electrode being formed of a metal film comprising, in superposition in order from the amorphous semiconductor layer side, layers of aluminum, an additive metal for aluminum bronze, and copper, wherein the metal film is deposited on the amorphous silicon layer by sputtering and the metal film has a thickness of about 0.2 to 0.8 μm.

2. An integrated photovoltaic device according to claim 1, wherein the additive metal for aluminum bronze is selected from the group consisting of nickel, iron, and manganese.

3. An integrated photovoltaic device according to claim 1, wherein the additive metal for aluminum bronze is nickel.

* * * * *